United States Patent [19]

Liman

[11] 4,006,419
[45] Feb. 1, 1977

[54] PULSE INTERFERENCE BLANKING CIRCUIT FOR RADIO RECEIVERS

[75] Inventor: Helmut Liman, Klein Escherde uber Hildesheim, Germany

[73] Assignee: Blaupunkt-Werke GmbH, Hildesheim, Germany

[22] Filed: July 25, 1975

[21] Appl. No.: 599,134

[30] Foreign Application Priority Data

Mar. 21, 1975 Germany .......................... 2512412

[52] U.S. Cl. ................................. 325/348; 325/478
[51] Int. Cl.² .......................................... H04B 1/10
[58] Field of Search .......... 325/473, 474, 480, 348, 325/478

[56] References Cited

UNITED STATES PATENTS

| | | | |
|---|---|---|---|
| 3,284,714 | 11/1966 | Battin et al. ......................... | 325/478 |
| 3,390,339 | 6/1968 | Kamerer et al. ................ | 325/348 X |
| 3,699,457 | 8/1971 | Wright ............................... | 325/348 |

Primary Examiner—Robert L. Richardson
Attorney, Agent, or Firm—William R. Woodward

[57] ABSTRACT

After a preliminary differentiation, the demodulated signal is supplied in parallel to a peak rectifier and to a second differentiating network, the outputs of the latter two circuits being added in the input circuit of a switching transistor that controls the blanking gate of a receiver. The value of the resistor across the output capacitor of the peak rectifier, as well as the rectifier capacitor, is so chosen in value that periodically recurrent pulses that may be persistently present in the signal build up a blocking bias on the switching transistor reducing its sensitivity and preventing corresponding differentiated pulses from switching it on, whereas occasionally or irregularly appearing pulses develop a negligible basis through the rectifier, so that their twice differentiated derived pulses will switch on the transistor and produce blanking.

2 Claims, 1 Drawing Figure

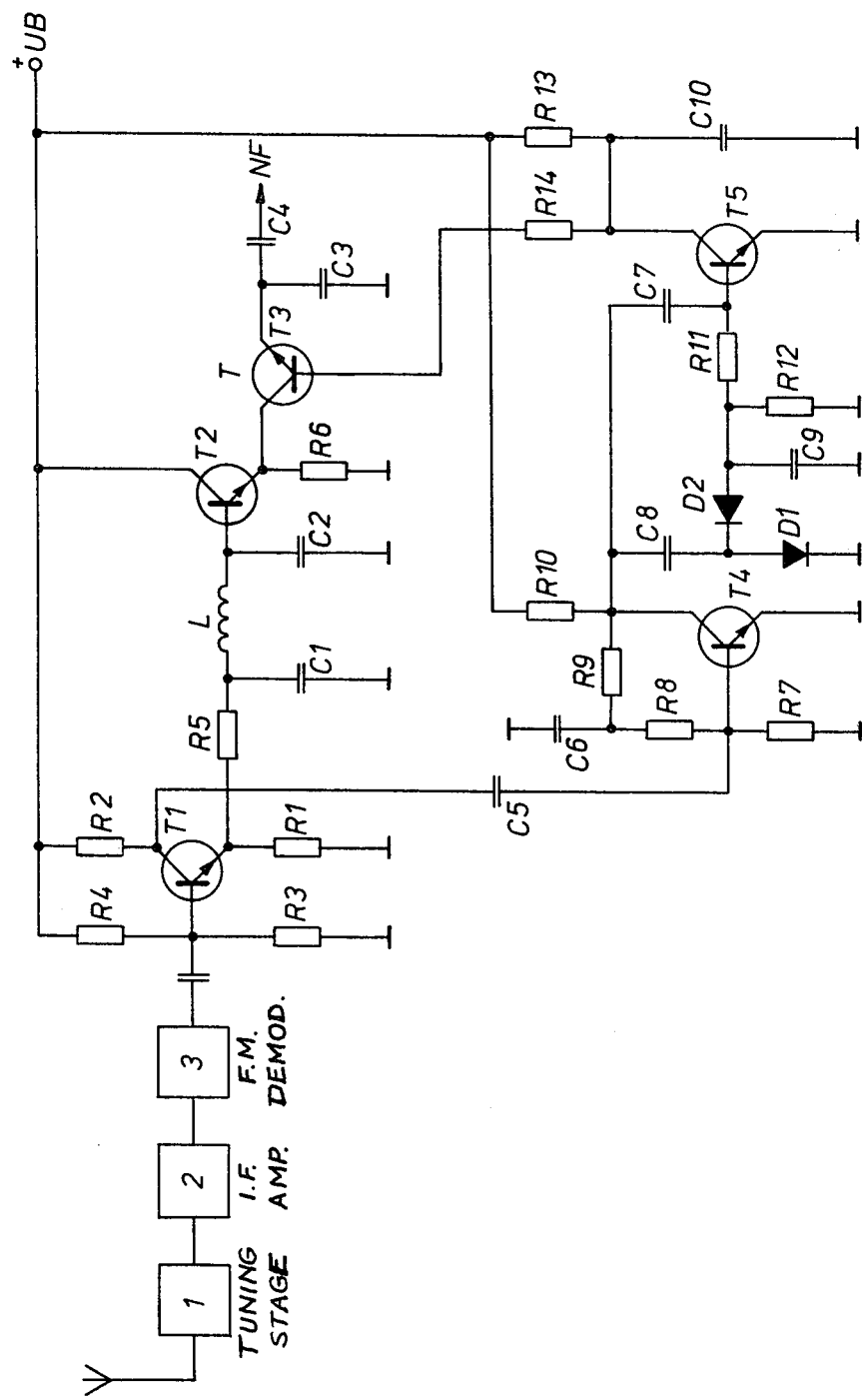

PULSE INTERFERENCE BLANKING CIRCUIT FOR RADIO RECEIVERS

This invention relates to an interference blanking circuit for an FM radio receiver in which a disturbance voltage detector is arranged to provide a blocking pulse to a gate circuit interposed in the low-frequency signal path of the receiver and in which a storage capacitor is provided on the output side of the gate circuit.

Circuits of the kind just mentioned prevent disturbance pulses that appear in the signal output of the FM demodulator of a receiver from reaching the low-frequency amplifier that constitutes the output stage of the receiver.

In the known circuits of this kind, disturbance pulses are supplied to a detector circuit through a differentiating network and the disturbance detector output triggers a monostable multivibrator that blocks the gate circuit interposed in the low-frequency signal path for a short time. During that interval only the value of the signal that was present in the above-mentioned storage capacitor shortly before the disturbance appeared is supplied to the low-frequency amplifier.

It has been found that when interruption ("blanking") of the signal is excessively frequent, even when every interruption is very brief, there is produced distortion of the signal. For this reason, a circuit has been proposed in which a closed control loop is provided to regulate the sensitivity of the disturbance pulse recognition circuit so that it becomes less sensitive with increasing frequency of operation, (i.e. with increasing repetition rate of blanking). If in a receiver so equipped there should appear at the FM demodulator output some high-frequency oscillations with approximately constant amplitude for a considerable period, as may be caused, for example, by a transmitter in an adjacent channel, the switching of the gate circuit becomes periodic and produces audible distortions or interference in the low-frequency received signal. Efforts to deal with this problem by cutting off the upper frequency band of the signals applied to the disturbance voltage detector resulted in adverse effects on the response sensitivity and accordingly proved fruitless.

It is an object of the present invention to provide an interference suppression circuit that is not subject to the above-described disadvantages.

SUBJECT MATTER OF THE PRESENT INVENTION

Briefly, the signal containing disturbances is differentiated in a first differentiating network and then supplied to two branch circuits, one of them a rectifying circuit and the second a second differentiating circuit fed in parallel to the rectifying circuit, and the outputs of these two branches are additively supplied to the control electrode of a switching transistor that in turn controls the gate circuit interposed in the low-frequency signal path of the receiver. The electrical components of the abovementioned branch circuits are so arranged that when a highfrequency disturbance voltage appears in the low-frequency signal path of the receiver, the switching transistor is supplied with a sufficient blocking voltage by the rectifying circuit that the twice differentiated high-frequency disturbance voltage pulses are ineffective, while it is still possible for irregularly appearing or occasionally additional disturbance pulses to switch on the switching transistor.

Preferably, the rectifying branch circuit works into a parallel resistor-capacitance combination as a load through which the second differentiating network finds its ground return, the resistor of that network being connected thereto and the base of the switching transistor being connected to the other end of the last-mentioned resistor so that the voltages developed by the rectifier branch and by the differentiator branch are additively applied to the base electrode of the switching transistor. It has also been found useful to provide an amplifying transistor to receive the output of the first differentiating circuit and to apply a corresponding output to the two branch circuits (rectifier circuit and second differentiator circuit) in parallel.

The advantages obtained by the circuit of the invention are particularly that persistent high-frequency disturbance signals do not disturbingly affect the low-frequency signal by continued periodic switching of the blanking gate, while at the same time isolated or irregularly appearing disturbance pulses are still able to operate the blanking gate to suppress the latter type of disturbance.

The invention is described by way of illustrative example with reference to the accompanying drawing, the single FIGURE of which is a circuit diagram partly in block form, and omitting the low-frequency stages following the interference suppression circuit, of a radio receiver provided with interference suppression in accordance with the present invention.

The receiver circuit shown in the drawing has the conventional front end circuits including a tuning stage 1, an intermediate frequency amplifier 2 and an FM demodulator 3 succeeding each other in that order. The low-frequency signal available at the output of the FM demodulator 3 is, in accordance with the already known practice, supplied to an emitter follower stage T1, R1, R2, R3, R4, a delay network R5, L, C1, C2, a second emitter follower stage T2, R6 and a gate circuit T successively. The gate circuit comprises a transistor T3 and a storage capacitor C3 on the output side of the gate transistor T3. The low-frequency signal then proceeds from the storage capacitor C3 through a coupling capacitor C4 to low-frequency stages, including at least an amplifier, not shown in the drawing.

The collector of the transistor T1 of the first emitter follower stage is connected through a capacitor C5 with the base of an npn transistor T4 of which the emitter is grounded (i.e. connected to a common low-impedance return path of the circuits at a steady and undisturbed potential). The base of the transistor T4, which is grounded through a resistor R7 is supplied with bias current and some feedback by the resistors R8 and R9 that are connected in series between the collector and the base of transistor T4. The interconnection point of the two resistors R8 and R9 is connected to a capacitor C6, the other terminal of which is grounded in order to establish the frequency characteristic of the feedback. The collector of the transistor T4 is also connected through a load resistor R10 with the positive voltage supply bus + UB and is further provided, for output purposes, with a capacitor C7 leading to the base electrode of a switching transistor T5 and with a second capacitor C8 leading to the anode of a first diode D1, of which the cathode is grounded. The anode of the first diode D1 is also connected to the cathode of a second diode D2, of which the anode is connected over a resistor R11 with the base of the previously mentioned switching transistor T5. The load of the rectifier circuit is provided by a resistor R12 shunted by a capacitor C9, this parallel combination being connected between the anode of the second diode D2 and ground.

The emitter of the switching transistor T5 is grounded, while the collector of that transistor is connected to ground through a capacitor C10 and to the positive voltage supply bus +UB through a resistor R13 and also, for output purposes, over another resistor R14 to the base of the transistor T3 which constitutes the blanking gate T.

In the absence of disturbance pulses, the transistor T3 of the blanking gate T is in its conducting condition. If disturbance pulses appear in the low-frequency signal, these are supplied through the differentiating network composed of the capacitor C5 and the resistor R7 to the base of the transistor T4, that base electrode as already mentioned being connected to the collector of the same transistor through a feedback network R8, R9, C6. (The feedback network being of low-pass characteristic, and supplying negative feedback, the result is to provide a high-pass characteristic for the amplifier, which may contribute a further differentiating effect). The differentiated and amplified pulse appearing at the collector of the transistor T4 is supplied to a second differentiating network comprising the capacitor C7 and the resistor R11, which is returned to ground through the resistor R12 shunted by a capacitor C9 rather than directly to ground for reasons that will presently appear. The base of the switching transistor T5 is connected to the interconnection of the capacitor C7 and the resistor R11 so that the differentiated voltage appearing across the resistor R11 may be made effective to control the transistor T5. This is similar to the connection of the differentiating network C5, R7 to the transistor T4. Of course, in that case the resistor R8 and the network to which it leads must be taken into consideration in determining the precise characteristic of the differentiating network, just as in the case of the second differentiating network, the effect of the ground return through R12 and C9 may need to be taken into account in a precise evaluation.

The basic operation of the circuit is that when a positive pulse reaches the base of the switching transistor T5, the latter becomes conducting and turns off the transistor T3 of the blanking gate T. The duration of the blocking of transistor T3 (known as the blanking interval) depends on the time constant of the combination of the capacitor C10 and its charging resistor R13.

The transistor T4, however, in responding to pulses differentiated by the network C5, R7 also energizes a rectifying circuit through the capacitor C8 connected to its collector. The pulse voltage supplied through capacitor C8 is rectified by the diodes D1 and D2 to produce a voltage across the parallel resistor capacitor combination R12, C9 and it biases the base of the transistor T5. The capacitors C8 and C9 have the effect of causing the rectifier circuit to operate as a peak voltage rectifier. The polarity of the diodes is such that a voltage appearing at the capacitor C9 reduces the response sensitivity of the switching transistor. Capacitor C9 and the resistor R12 are so chosen with respect to their electrical magnitude, that occasional isolated pulses or irregularly recurring disturbing pulses cannot appreciably increase the voltage charge of the capacitor C9. If, however, high-frequency repeating pulses appear and continue for an appreciable time, as in the case of reception of the signal of a transmitter on a neighboring channel, the capacitor C9 will charge up. The circuit components are of such magnitude that the voltages developed in the rectifying circuit C8, T1, T2, C9 bias the transistor T5 so far in the blocking direction that the twice differentiated pulses derived from the high-frequency repeating pulses (and appearing across the resistor R11) are not able to turn on the transistor T5. If, however, additional individual pulses and/or irregular disturbance pulses are present, only a negligible increase of the voltage of the capacitor C9 will be produced and the switching transistor T5 can still be switched on by the positive pulses derived by differentiation of these last-mentioned disturbance pulses.

Although the invention has been described with reference to an illustrative example, it will be understood that variations are possible within the inventive concept.

I claim:
1. A pulse interference suppression circuit for a radio receiver having a demodulator circuit, said interference suppression circuit comprising, in combination:
first signal differentiating means for differentiating the signal appearing at the output of a demodulator of a radio receiver and supplying a differentiated signal to the remainder of the interference suppression circuit, said first differentiating means including an amplifying transistor (T4) providing a differentiated signal output, a high-pass input coupling network (C5, R7) for said amplifying transistor connecting the control electrode of said transistor to said demodulator output, and a low-pass feedback and bias network (C6, R8, R9) for said transistor providing bias current as well as feedback to said control electrode;
rectifier means (C8, D1, D2, C9, R12) having the input thereof connected through a first capacitor (C8) to said differentiated signal output and arranged to provide rectified current to charge a second capacitor (C9) that is bridged by a first resistor;
second signal differentiating means constituted by a third capacitor (C7) connected to said differential signal output and connected in series with a second resistor (R11) that has its other connection connected to the output of said rectifier means;
a switching transistor (T5) having its control electrode connected to said second signal differentiating means at the junction of said third capacitor and said second resistor and having an output network (R13, C10) for providing a predetermined pulse duration in the output of said switching transistor whenever said switching transistor is switched on;
said rectifying means being poled so as to provide a bias for said switching transistor that must be overcome by the output of said second differentiating means to cause said switching transistor to be switched on, and
blanking switch means (T3) for said radio receiver having a signal input connected through a delay circuit to said demodulator output and having a switching input in circuit with said output network of said switching transistor,
whereby the magnitude of said first capacitor (C8) limits the increment of charge of said second capacitor (C9) produced by said rectifying means in response to a single pulse in the output of said amplifying transistor, but the persistent presence of a high-frequency periodic disturbing voltage cumulatively biases off said switching transistor to such an extent that pulses derived from said high-frequency periodic disturbing voltage by said second differentiating circuit are rendered unable to turn on said switching transistor without precluding isolated disturbing pulses of higher peak voltage from turning on said switching transistor and thereby producing a pulse of said duration determined by said output network of said switching transistor.

2. A circuit as defined in claim 1, in which said amplifying transistor has its collector connected through said second capacitor (C7) to the base of said switching transistor (T5) and has its collector also connected by said first capacitor (C8) of said rectifying means to the interconnection point of two series connected diodes (D1, D2) forming part of said rectifying means, of which one (D1) has its other connection grounded and the second (D2) has its other connection connected to the junction of said first resistor (R12), said second capacitor (C9) and said second resistor (R11).

* * * * *